(12) United States Patent
Streefkerk et al.

(10) Patent No.: US 9,733,575 B2
(45) Date of Patent: *Aug. 15, 2017

(54) LITHOGRAPHIC APPARATUS AND DEVICE MANUFACTURING METHOD

(71) Applicant: ASML NETHERLANDS B.V., Veldhoven (NL)

(72) Inventors: Bob Streefkerk, Tilburg (NL); Antonius Theodorus Anna Maria Derksen, Eindhoven (NL); Joeri Lof, Eindhoven (NL); Klaus Simon, Eindhoven (NL); Alexander Straaijer, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 15/174,773

(22) Filed: Jun. 6, 2016

(65) Prior Publication Data

US 2016/0282726 A1   Sep. 29, 2016

Related U.S. Application Data

(63) Continuation of application No. 14/541,037, filed on Nov. 13, 2014, now Pat. No. 9,383,655, which is a (Continued)

(30) Foreign Application Priority Data

Jul. 16, 2003   (EP) .................................... 03254466

(51) Int. Cl.
G03B 27/52 (2006.01)
G03B 27/42 (2006.01)
G03F 7/20 (2006.01)

(52) U.S. Cl.
CPC ...... *G03F 7/70341* (2013.01); *G03F 7/70258* (2013.01); *G03F 7/70716* (2013.01); *G03F 7/70875* (2013.01); *G03F 7/70891* (2013.01)

(58) Field of Classification Search
CPC ............ G03F 7/70341; G03F 7/70258; G03F 7/70875; G03F 7/70891
(Continued)

(56) References Cited

U.S. PATENT DOCUMENTS 3,573,975 A   4/1971   Dhaka et al.
3,648,587 A   3/1972   Stevens
(Continued)

FOREIGN PATENT DOCUMENTS

DE   206 607   2/1984
DE   221 563   4/1985
(Continued)

OTHER PUBLICATIONS

M. Switkes et al., "Immersion Lithography at 157 nm", MIT Lincoln Lab, Orlando 2001-1, Dec. 17, 2001.
(Continued)

*Primary Examiner* — Hung Henry Nguyen
(74) *Attorney, Agent, or Firm* — Pillsbury Winthrop Shaw Pittman LLP

(57) ABSTRACT

An immersion lithography apparatus comprises a temperature controller configured to adjust a temperature of a projection system, a substrate and a liquid towards a common target temperature. Controlling the temperature of these elements and reducing temperature gradients may improve imaging consistency and general lithographic performance. Measures to control the temperature may include controlling the immersion liquid flow rate and liquid temperature, for example, via a feedback circuit.

20 Claims, 5 Drawing Sheets

Related U.S. Application Data continuation of application No. 12/795,513, filed on Jun. 7, 2010, now Pat. No. 8,913,223, which is a continuation of application No. 10/890,400, filed on Jul. 14, 2004, now Pat. No. 7,738,074.

(58) Field of Classification Search
USPC .............................................. 355/30, 53, 72
See application file for complete search history.

(56) References Cited

U.S. PATENT DOCUMENTS

| | | |
|---|---|---|
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,503,335 A | 3/1985 | Takahashi |
| 4,509,852 A | 4/1985 | Tabarelli et al. |
| 4,730,900 A | 3/1988 | Uehara et al. |
| 4,825,247 A | 4/1989 | Kemi et al. |
| 5,040,020 A | 8/1991 | Rauschenbach et al. |
| 5,121,256 A | 6/1992 | Corle et al. |
| 5,137,349 A | 8/1992 | Taniguchi et al. |
| 5,142,132 A | 8/1992 | MacDonald et al. |
| 5,231,291 A | 7/1993 | Amemiya et al. |
| 5,402,224 A | 3/1995 | Hirukawa et al. |
| 5,577,552 A | 11/1996 | Ebinuma et al. |
| 5,610,683 A | 3/1997 | Takahashi |
| 5,638,687 A | 6/1997 | Mizohata et al. |
| 5,715,039 A | 2/1998 | Fukuda et al. |
| 5,825,043 A | 10/1998 | Suwa |
| 5,883,704 A | 3/1999 | Nishi et al. |
| 5,900,354 A | 5/1999 | Batchelder |
| 5,974,816 A | 11/1999 | Endo |
| 6,191,429 B1 | 2/2001 | Suwa |
| 6,236,634 B1 | 5/2001 | Lee et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,645,701 B1 | 11/2003 | Ota et al. |
| 6,699,630 B2 | 3/2004 | Ota |
| 6,731,371 B1 | 5/2004 | Shiraishi |
| 6,809,794 B1 | 10/2004 | Sewell |
| 6,867,844 B2 | 3/2005 | Vogel et al. |
| 6,952,253 B2 | 10/2005 | Lof et al. |
| 6,954,255 B2 | 10/2005 | Hasegawa et al. |
| 6,954,256 B2 | 10/2005 | Flagello et al. |
| 7,009,682 B2 | 3/2006 | Bleeker |
| 7,050,146 B2 | 5/2006 | Duineveld |
| 7,061,573 B2 | 6/2006 | Tsukamoto |
| 7,075,616 B2 | 7/2006 | Derksen et al. |
| 7,081,943 B2 | 7/2006 | Lof et al. |
| 7,193,232 B2 | 3/2007 | Lof et al. |
| 7,199,858 B2 | 4/2007 | De Smit et al. |
| 7,213,963 B2 | 5/2007 | Lof et al. |
| 7,227,616 B2 | 6/2007 | Graeupner |
| 7,317,504 B2 | 1/2008 | De Smit |
| 7,326,522 B2 | 2/2008 | Dierichs |
| 7,352,434 B2 | 4/2008 | Streefkerk et al. |
| 7,359,030 B2 | 4/2008 | Simon et al. |
| 7,394,521 B2 | 7/2008 | Van Santen et al. |
| 7,463,330 B2 | 12/2008 | Streefkerk et al. |
| 7,466,392 B2 | 12/2008 | Nagasaka et al. |
| 7,545,481 B2 | 6/2009 | Streefkerk et al. |
| 7,589,818 B2 | 9/2009 | Mulkens et al. |
| 7,684,008 B2 | 3/2010 | De Smit |
| 7,738,074 B2 | 6/2010 | Streefkerk et al. |
| 9,383,655 B2 * | 7/2016 | Streefkerk .......... G03F 7/70258 |
| 2002/0020821 A1 | 2/2002 | Van Santen et al. |
| 2002/0163629 A1 | 11/2002 | Switkes et al. |
| 2003/0035090 A1 | 2/2003 | Imai et al. |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0119954 A1 | 6/2004 | Kawashima et al. |
| 2004/0125351 A1 | 7/2004 | Krautschik et al. |
| 2005/0007569 A1 | 1/2005 | Streefkerk et al. |
| 2005/0122497 A1 | 6/2005 | Lyons et al. |
| 2005/0146694 A1 | 7/2005 | Tokita |
| 2005/0259234 A1 | 11/2005 | Hirukawa et al. |
| 2005/0264780 A1 | 12/2005 | Graeupner |
| 2006/0028632 A1 | 2/2006 | Hazelton et al. |
| 2006/0034344 A1 | 2/2006 | Hirano et al. |
| 2006/0082744 A1 | 4/2006 | Hirukawa |

FOREIGN PATENT DOCUMENTS

| | | |
|---|---|---|
| DE | 224448 | 7/1985 |
| DE | 242880 | 2/1987 |
| DE | 102 57 766 | 7/2004 |
| EP | 0023231 | 2/1981 |
| EP | 0418427 | 3/1991 |
| EP | 0 605 103 A | 7/1994 |
| EP | 1039511 | 9/2000 |
| FR | 2474708 | 7/1981 |
| JP | 58-202448 | 11/1983 |
| JP | S61-100929 | 5/1986 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 6-84757 | 3/1994 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | H10-303115 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2001-143992 | 5/2001 |
| JP | 2001-244178 | 9/2001 |
| JP | 2002-118050 | 4/2002 |
| JP | 2002-341249 | 11/2002 |
| JP | 2003-059807 | 2/2003 |
| JP | 2003-151898 | 5/2003 |
| JP | 2004-193252 | 7/2004 |
| JP | 2004-296648 | 10/2004 |
| JP | 2004-343114 | 12/2004 |
| JP | 2005- 012201 | 1/2005 |
| JP | 2005-051231 | 2/2005 |
| JP | 2006-509357 | 3/2006 |
| KR | 1999-0034784 | 5/1999 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | 2008/009356 | 1/2008 |

OTHER PUBLICATIONS

M. Switkes et al., "Immersion Lithography at 157 nm", J. Vac. Sci. Technol. B., vol. 19, No. 6, Nov./Dec. 2001; pp. 2353-2356.

(56) References Cited

OTHER PUBLICATIONS

M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "⅛μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, "The $k_3$ coefficient in nonparaxial λ/NA scaling equations for resolution, depth of focus, and immersion lithography," J. Microlith., Microfab., Microsyst. 1(l):7-12 (2002).
European Search Report for European Application No. 03 25 4466.0, dated Jul. 2, 2004.
Search Report for European Application No. EP 04254057.5, dated Sep. 21, 2004.
Search Report for European Application No. EP 04254057.5, dated Jan. 5, 2005.
Japanese Office Action issued for Japanese Patent Application No. 2004-207959, dated Sep. 4, 2007.
Chinese Office Action for Application No. 200410064067.8, dated Apr. 4, 2008.
English Translation of Second Chinese Official Action issued on Dec. 5, 2008 in Chinese Application No. 200410064067.8.
U.S. Office Action issued for U.S. Appl. No. 11/029,674, dated Jan. 9, 2007.
U.S. Office Action issued for U.S. Appl. No. 11/029,674, dated Sep. 5, 2006.
U.S. Office Action dated Jun. 7, 2013 in corresponding U.S. Appl. No. 11/482,121.
U.S. Office Action dated Dec. 5, 2013 in corresponding U.S. Appl. No. 13/287,733.
Notice of Allowance dated Nov. 26, 2013 in corresponding U.S. Appl. No. 11/482,121.
Japanese Office Action mailed Mar. 4, 2014 in corresponding Japanese Patent Application No. 2012-061788.
Japanese Office Action mailed Apr. 26, 2016 in corresponding Japanese Patent Application No. 2014-152937.
Japanese Office Action mailed Apr. 26, 2016 in corresponding Japanese Patent Application No. 2015-142942.

\* cited by examiner

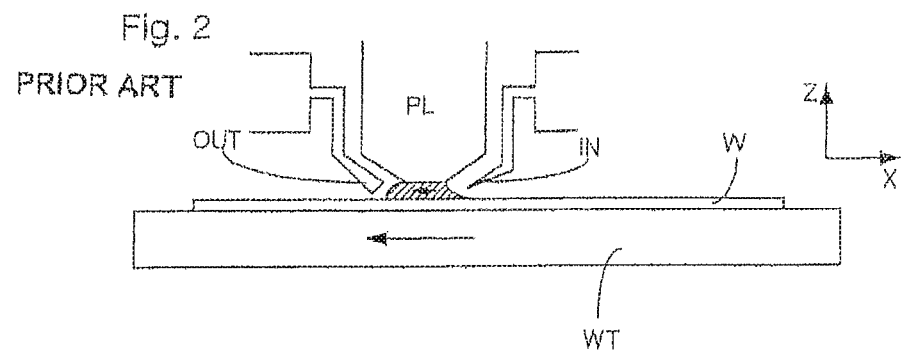
Fig. 2 PRIOR ART
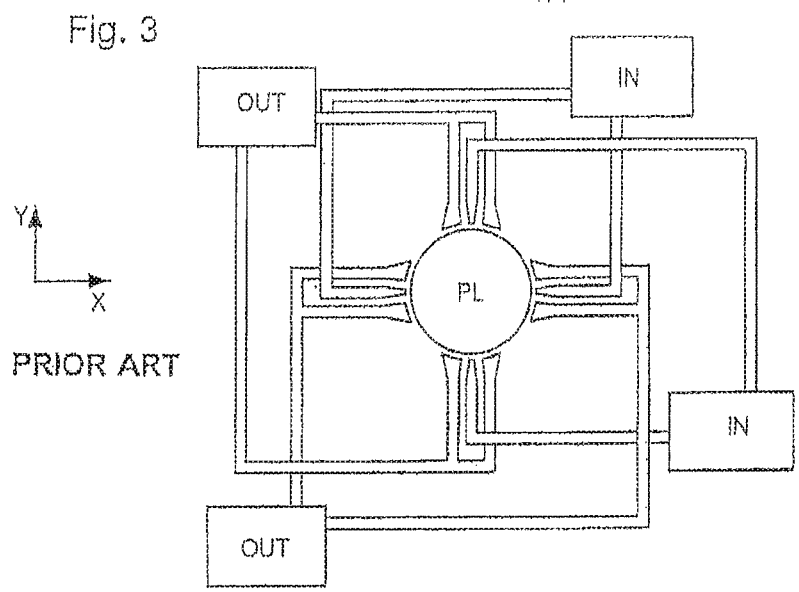
Fig. 3 PRIOR ART
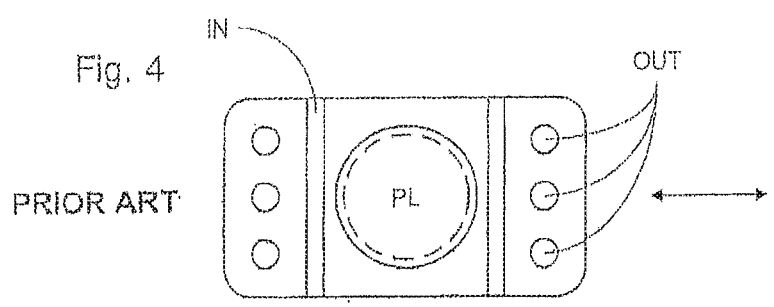
Fig. 4 PRIOR ART
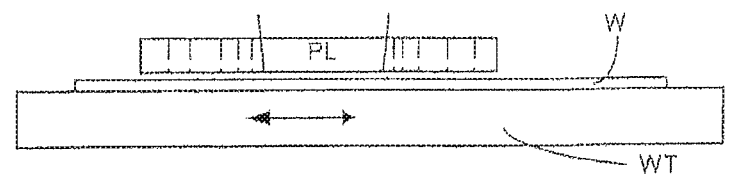

LITHOGRAPHIC APPARATUS AND DEVICE MANUFACTURING METHOD

This application is a continuation of U.S. patent application Ser. No. 14/541,037, filed Nov. 13, 2014, now U.S. Pat. No. 9,383,655, which is a continuation of U.S. patent application Ser. No. 12/795,513, filed Jun. 7, 2010, now U.S. Pat. No. 8,913,223, which is a continuation of U.S. patent application Ser. No. 10/890,400, filed Jul. 14, 2004, now U.S. Pat. No. 7,738,074, which claims priority from European Patent Application No. EP 03254466.0, filed Jul. 16, 2003, the entire contents of each of the foregoing applications incorporated herein in its entirety.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

It is typically important to reduce or minimize temperature variations in components that influence the path of imaging radiation. Thermal expansion and contraction of optical components such as lenses and mirrors may lead to distortions of the image reaching the substrate as may temperature induced variations in the refractive index of an immersion liquid in an immersion lithographic apparatus. Control of component temperatures is normally possible by limiting the extent and proximity of dissipative processes, both electrical and mechanical, or of any other heat flux sources (i.e. sources that provide or absorb heat), and ensuring good thermal connection between components and high heat capacity elements. However, despite employing measures such as these with regard to optical elements, image distortions traceable to variations in temperature and/or in local beam intensity continue to be detected.

SUMMARY

Accordingly, it would be advantageous, for example, to reduce image distortion due to temperature gradients in the substrate and immersion liquid.

According to an aspect of the invention, there is provided a lithographic apparatus comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, the liquid supply system comprising a temperature controller configured to adjust the temperature of the substrate, the liquid and at least a part of the projection system towards a substantially common target temperature.

According to a further aspect of the invention, there is provided a lithographic apparatus comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

a liquid supply system configured to at least partly fill a space between the projection system and the substrate with a liquid; and a projection system compensator configured to adjust an optical property of the projection system in response to a distortion in a pattern exposed on the substrate caused by a difference in temperature of the projection system, the substrate, the liquid, or any combination thereof, from a target temperature.

According to a further aspect of the invention, there is provided a device manufacturing method comprising:

projecting, using a projection system of a lithographic apparatus, a patterned beam of radiation through a liquid onto a target portion of a substrate; and adjusting the temperature of the substrate, the liquid and at least a part of the projection system towards a substantially common target temperature.

According to a further aspect of the invention, there is provided a device manufacturing method comprising:

projecting, using a projection system of a lithographic apparatus, a patterned beam of radiation through a liquid onto a target portion of a substrate; and adjusting an optical property of the projection system in response to a distortion in a pattern exposed on the substrate caused by a difference in temperature of the projection system, the substrate, the liquid, or any combination thereof, from a target temperature.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
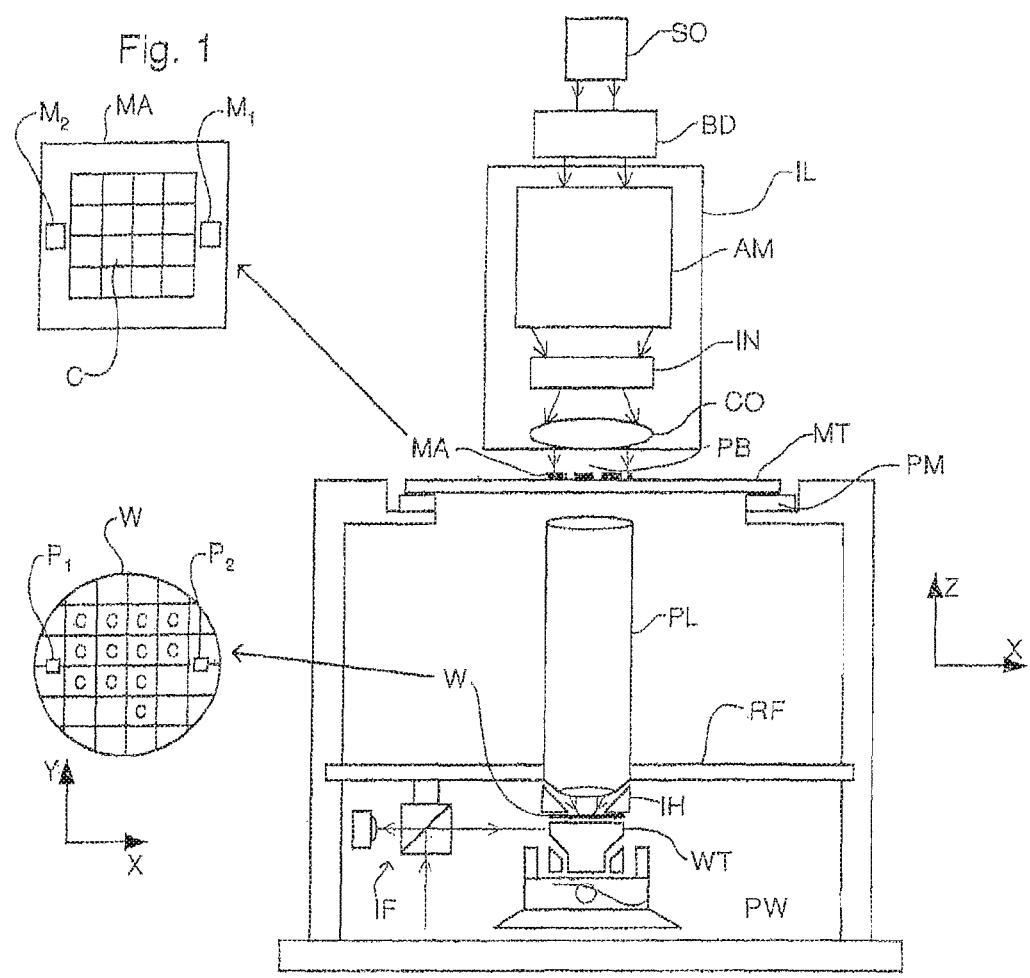
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
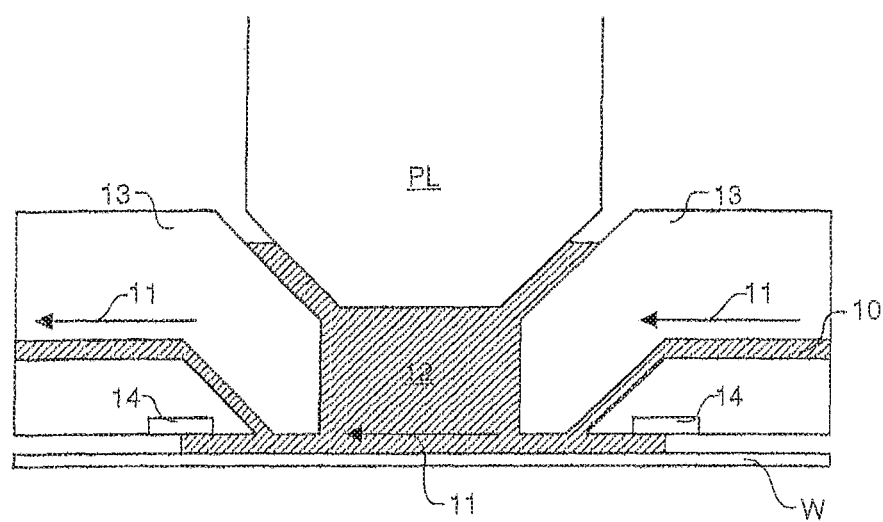
FIG. 5 depicts a liquid supply system and seal member according to an embodiment of the invention.
Figure 6:
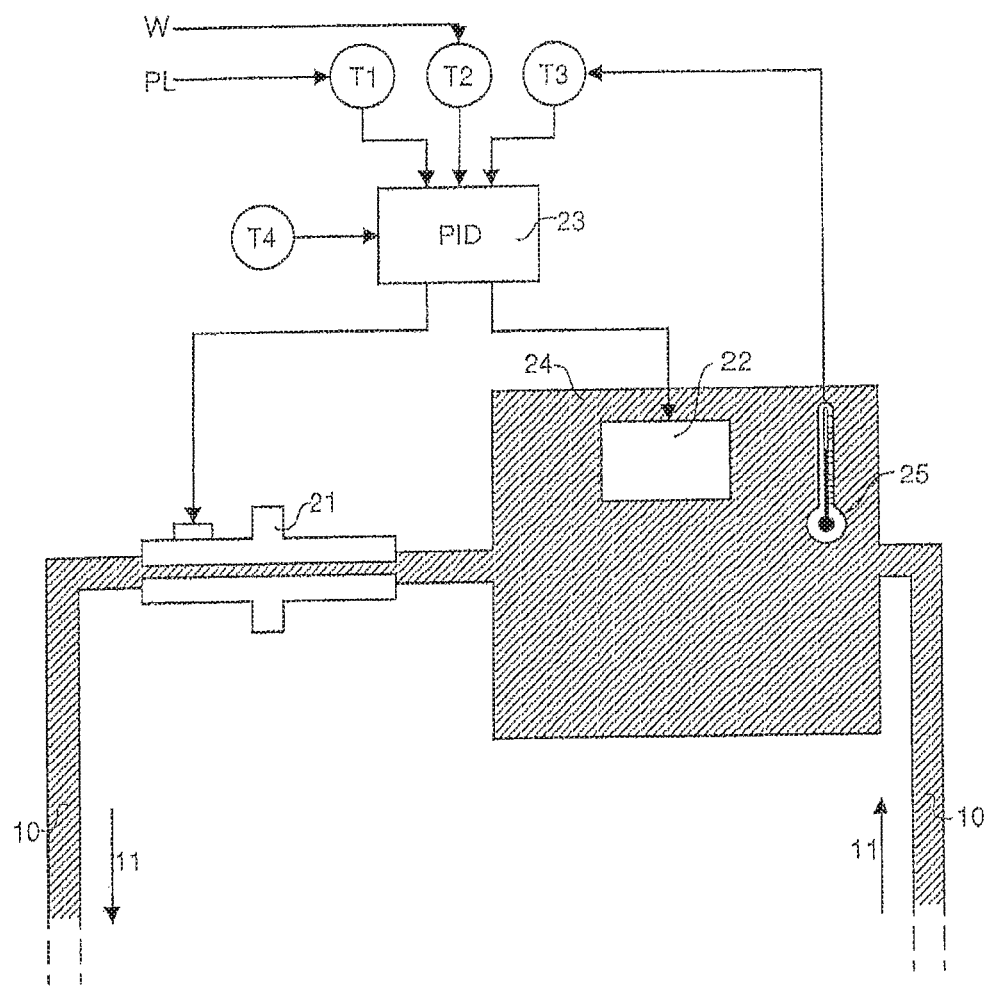
FIG. 6 depicts a flow rate adjustment device and liquid temperature adjustment device according to an embodiment of the invention.

FIGS. 5 and 6 show a liquid supply system 10 and features 21, 22 and 23 of the temperature controller according to an embodiment of the invention. The projection system PL, substrate W and immersion liquid may have temperature dependent properties that may influence the quality of the image projected to the substrate W. Heat flux from various sources may lead to temperature offsets in one or more of these elements and even to temperature gradients if no counter-measures are employed. This possibility may be exacerbated by the relatively low thermal conductance and heat capacity of the substrate (due both to the material used and the thin geometry). Temperature gradients may lead to thermal expansion/contraction gradients that, depending on the element in question may distort the projected image. This may be a particularly difficult problem when the temperature profile changes as the imaging beam moves relative to the substrate W, as may occur in the substrate itself, for example. In the case of the immersion liquid, localized hotspots or cold spots on the substrate W may also lead to temperature gradients in the liquid, with liquid located close to the hotspots/cold spots being higher/lower in temperature than liquid located further away. Since the refractive index is generally temperature dependent, this may influence the path the imaging radiation takes through the liquid and will distort the image. By using a temperature controller that ensures not only the constancy of the projection system temperature but also that of the substrate W and immersion liquid, distortion of the image due to these factors may be reduced.

In the embodiment shown, the liquid supply system 10 supplies liquid to an imaging-field reservoir 12 between the projection system PL and the substrate W. The liquid is, in an embodiment, chosen to have a refractive index substantially greater than 1 meaning that the wavelength of the projection beam is shorter in the liquid than in air or a vacuum, allowing smaller features to be resolved. It is well known that the resolution of a projection system is determined, inter alia, by the wavelength of the projection beam and the numerical aperture of the system. The presence of the liquid may also be regarded as increasing the effective numerical aperture.

The reservoir 12 is bounded at least in part by a seal member 13 positioned below and surrounding the final element of the projection system PL. The seal member 13 extends a little above the final element of the projection system PL and the liquid level rises above the bottom end of the final element of the projection system PL. The seal member 13 has an inner periphery that at the upper end closely conforms to the step of the projection system or the final element thereof and may, e.g., be round. At the bottom, the inner periphery closely conforms to the shape of the image field, e.g. rectangular but may be any shape.

Between the seal member 13 and the substrate W, the liquid may be confined to the reservoir by a contact-less seal 14, such as a gas seal formed by gas provided under pressure to the gap between the seal member 13 and the substrate W.

As has been discussed above, lithographic apparatuses may be extremely sensitive to thermally induced changes to the physical properties of optical elements. These changes may include thermal expansion/contraction or changes in intrinsic properties such as refractive index. In an apparatus as complex as a typical lithography apparatus, there will inevitably be a number of important heat flux sources that may contribute to temperature variations in critical areas. These sources may derive from dissipation arising in electrically driven devices, with or without moving parts, from variations in the external environment temperature, and/or from evaporation/condensation of fluids. An important source of heat stems from the absorption of imaging radiation by the substrate W (leading to overlay errors). This source may also heat the substrate table holding the substrate W and the immersion liquid via convection from the substrate. Bulk temperature increases may arise via this mechanism particularly for shorter wavelength radiation, such as 157 nm. Care may be taken to minimize heating caused within the apparatus and to prevent excessive variations in the external environment temperature but it is difficult to completely eradicate their effects particularly where dissipative heating occurs within the optical system itself.

These temperature variations may be relatively homogeneous leading to uniform changes in the image reaching the substrate W (such as uniform translation or magnification/ shrinkage) or they may include contributions with a stronger spatial dependence. These latter variations may be considered more damaging because they may distort the image in a non-uniform way. The substrate W, for example, may be particularly vulnerable to such temperature variations since it is heated locally by the imaging radiation. In immersion lithography systems, the immersion liquid may also lead to temperature dependent optical properties because the refractive index of the liquid may vary with temperature.

Thermal management of these components is not amenable to the same methods used for standard optical elements. In the case of the substrate W, several factors are important. To begin with, the plate-like geometry of the substrate W suffers in two respects: firstly, each portion of the substrate W is in relatively poor thermal contact with the rest of the substrate W, so that heat disperses slowly, and secondly, the heat capacity of the substrate W per unit area will be reduced relative to a thicker slab. Both of these factors mean that a smaller amount of energy from the imaging radiation or other heat flux source may be necessary to locally heat or cool the substrate W to a given temperature. Furthermore, these problems may be compounded by the fact that strict alignment tolerances and the required mobility of the substrate W greatly restrict the deployment of mechanical thermal connections to the substrate W. In the case of the immersion liquid, heat exchanged between the substrate W and the liquid tends to heat or cool the liquid in a non-uniform way by convective currents and the like stimulated by temperature induced density variations rather than by conduction. Within a stationary liquid, this process may happen slowly leading to substantial temperature (and thus refractive index) gradients within the liquid. The contact area between the liquid and the substrate is relatively large so that heat may be exchanged efficiently between the two.

In the embodiments depicted in FIGS. 5 and 6, the immersion liquid exchanges heat with the final element of the projection system PL and the substrate W. In order to carry the heated or cooled liquid away, the liquid is made to flow (see arrows 11) through the imaging-field reservoir 12. Convection typically tends to take place within a thin layer (approximately 300 μm) near the heated or cooled element in contact with the liquid, due to the effects of laminar flow. More effective heat exchange may be obtained by directing the flow towards the heated or cooled element in question (i.e. towards the substrate W in the embodiment shown in FIG. 5). Particularly in the case where the temperature of the substrate W is of concern, it may be advantageous to position the immersion liquid outlet underneath the seal member 13 (as shown) and directed towards the substrate W. This arrangement may help to ensure relatively fresh immersion liquid near to the substrate W and minimize or reduce the influx of excessively heated or cooled liquid that may be dragged into the imaging-field reservoir 12 at its lower boundaries (where the seal member 13 meets the substrate W).

Increasing the flow rate may also improve the heat exchange between the liquid and elements with which it is in contact. In order to exploit this fact, the temperature controller may comprise a liquid flow rate adjustment device 21, the liquid flow rate being adjusted so as to optimize a difference between a common target temperature and the temperatures of the final element of the projection system PL, the substrate W and the liquid. Heat exchange with the liquid causes the temperatures of the final element of the projection system and the substrate to tend towards the temperature of the liquid. Increasing the flow rate of liquid over these elements increases the efficiency of this process. However, there may be a limit to how high the flow rate can reach without itself degrading imaging performance via turbulence or frictional heating. The flow rate controlling process may be carried out by varying the power of a pumping device, used to circulate the immersion liquid, or by changing the flow impedance of the liquid supply system 10 (by changing the cross-section of circulation channels forming part thereof, for example).

The temperature controller may also comprise a liquid temperature adjustment device 22, the temperature of the liquid flowing in the liquid supply system 10 being adjusted so as to optimize a difference between a common target temperature and the temperatures of the final element of the projection system PL, the substrate W and the liquid. Adjusting the temperature of the immersion liquid may be carried out inside a temperature adjustment reservoir 24, within which the temperature adjustment device 22 may be immersed along with thermometry 25. The temperature adjustment device 22 may act to cool the liquid, via a refrigeration device, towards the common target temperature or below to compensate for heating of the liquid elsewhere in the liquid supply system 10. Alternatively, the temperature adjustment device 22 may act to heat the liquid, for example by means of an electrical heater, towards the common target temperature or above. The action of the temperature adjustment device 22 may be realized by a liquid-to-liquid heat exchanger with a first input being to the immersion liquid and a second input to a supply of temperature controlled water. An advantage of this arrangement is that a supply of temperature controlled water may already be available from arrangements to service other parts of the lithographic apparatus. The projection system PL, for example, may already be cooled by a continuous flow of such water. Additionally, the temperature controlled water does not need to be chemically purified because it is recirculated.

The temperature controller may comprise a PID (Proportional-Integral-Differential) controller 23, a type of feedback controller, for achieving efficient convergence towards the common target temperature. The PID controller 23 may, for example, be arranged to ensure efficient convergence of one of more of the temperatures of the final element of the projection system, the substrate W and the liquid with the common target temperature (i.e. as quickly as possible and without overshoot).

The PID controller 23 controls the operation of the flow rate adjustment device 21 and/or the liquid temperature adjustment device 22, taking as input the temperature profile of the final element of the projection system T1 (in an embodiment, measured at a plurality of locations), the temperature profile of the substrate and substrate table T2 (in an embodiment, measured at a plurality of locations), the temperature profile of the liquid T3 (in an embodiment, measured at a plurality of locations), and the common target temperature T4. The operation of the PID controller 23 is not limited to the above context and may be used to regulate cooling processes throughout the lithographic apparatus.

The common target temperature may be set to a predetermined value. The predetermined value may be determined by the temperature at which the projection system has been calibrated.

Figure 7:
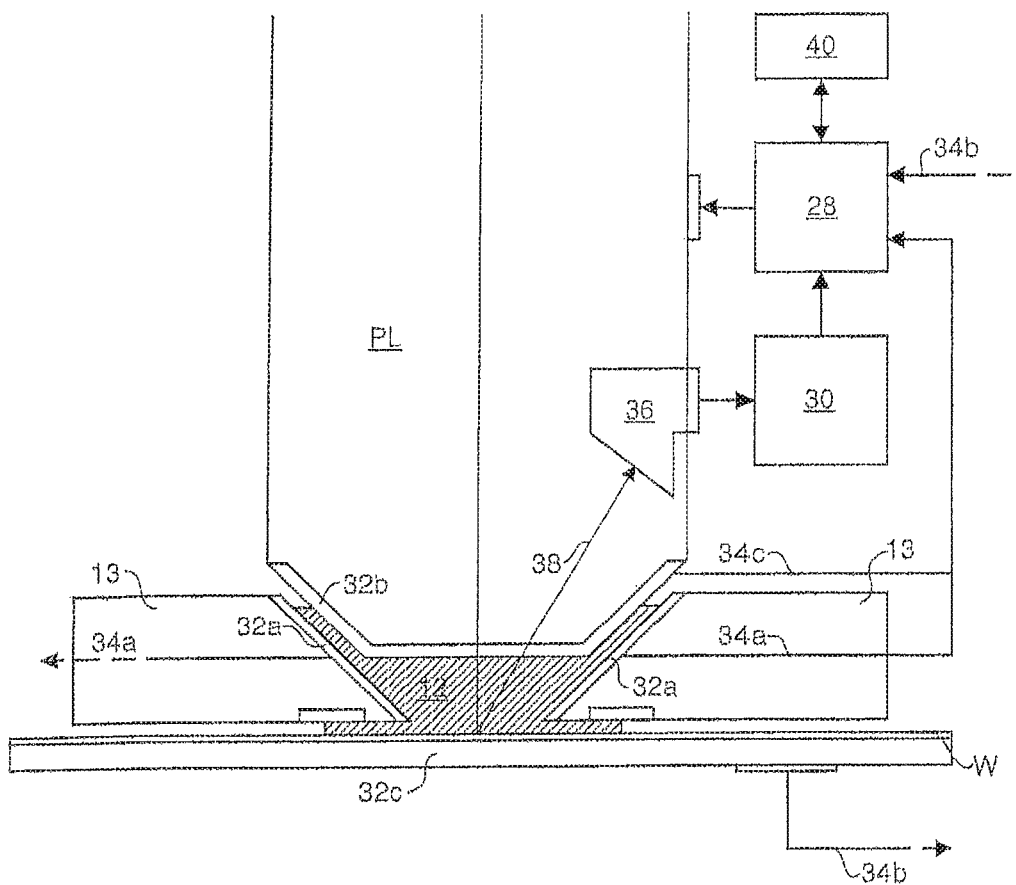
FIG. 7 depicts a lithographic apparatus according to an embodiment of the invention, comprising a projection system compensator, patterned radiation beam distortion detector, temperature sensor and storage device.

It has been described above how temperature variations in optically critical components, such as the final element of the projection system PL, the substrate W and the immersion liquid, can damage the imaging properties of the lithographic apparatus. FIG. 7 depicts an embodiment in which radiation beam distortions arising in this way are compensated using a projection system compensator 28, which is configured to adjust the optical properties of the projection system PL in response to a distortion in the pattern generated on the substrate W caused by a difference in temperature of at least one of the final element of the projection system PL, the substrate W and the liquid from a target temperature (such as a temperature at which the system has been calibrated). The distortion in the pattern generated on the substrate W may be caused either by a distortion in the patterned radiation beam, caused for example by variations in the temperature of the immersion liquid and/or final element of the projection system PL from the target temperature, or by temperature induced distortions of the substrate during exposure by the patterned radiation beam (which may or may not be distorted) or distortions in the pattern generated on the substrate W occurring in this case when the distorted substrate regains its normal form.

The projection system compensator 28 can adjust the imaging properties of the projection system PL via one or more adjustable elements arranged therein (such as actuatable lenses or moveable mirrors). The effect that these adjustments will have on the form of the patterned radiation beam will be calibrated beforehand. This may be achieved by actuating each adjustable element over its operating range and analyzing the form of the patterned radiation beam that emerges. Generally speaking, a radiation beam distortion can be expressed as an expansion in fundamental distortion modes (such as those expressed by a Zernike series, for example). A calibration table may comprise matrices consisting of coefficients in such an expansion and settings for each adjustable element. If the adjustable elements are chosen to cover adequately the main types of distortion, their use in concert should enable compensation of most types of distortion that are likely to occur from temperature variations in the immersion liquid and the elements surrounding it.

The projection system compensator 28 may receive input from a patterned radiation beam distortion detector 30, which in the example embodiment illustrated is linked to an optical detector 36 within the projection system PL but alternative devices may also be provided for this purpose. The optical detector 36 here is arranged to capture stray light 38 from the main patterned radiation beam that reflects from the substrate. This stray light may be analyzed to determine the patterned beam distortion by the patterned beam distortion detector 30. This may be achieved, for example, by means of a comparator, which compares the detected radiation with a standard pattern that was obtained under control conditions. The extent of deviation from the standard pattern can be analyzed to characterize distortion of the patterned beam. This approach has the advantage of being a direct measure of temperature induced distortions. It is also applicable in-situ during normal operation of the lithographic apparatus and as such enables the projection system compensator to work dynamically in real time.

An alternative or additional approach is to measure the temperature profile of the elements likely to cause distortion of the patterned radiation beam and determine from calibration measurements or calculation what the resulting distortion is likely to be. The projection system compensator 28 may then compensate the projection system PL as described above without directly measuring the distortion itself. FIG. 7 shows schematic arrangements of components 32a, 32b and 32c of a temperature sensor. These components 32a, 32b and 32c are depicted as layers and may, for example, each comprise one or a plurality of thermometers, which may be arranged to determine the temperature of at least a part of the final element of the projection system PL, the substrate W (and/or substrate table WT), the liquid, or any combination thereof. Each of the components 32a, 32b and 32c are capable of communicating with the projection system compensator 28 via data transmission lines 34a, 34b and 34c. The amount of adjustment to apply to each of the adjustable elements of the projection system PL requires reference in this case to a second calibration table, which is stored in a storage device 40. In this case, the calibration data stores information derived from previous measurements recording the relationship between a given element temperature or temperature profile and the resulting distortion. Once the predicted distortion is established, the projection system compensator can operate as it would had the distortion information been forwarded from the patterned radiation beam distortion detector 28.

The process thus described may be carried out in real time to adapt dynamically to unexpected and/or uncontrollable temperature variations in the region around the imaging-field reservoir 12. As depicted, the projection system compensator 28 and the patterned radiation beam distortion detection device 30 may form a feedback loop, which may be arranged to keep radiation beam distortion within certain predefined limits. A PID controller similar to that employed to control the immersion liquid temperature may be incorporated to ensure stability and efficient convergence.

In an embodiment, the above arrangements have an advantage of being able to respond quickly to small variations in the temperature of critical elements. The system may usefully be used in combination with systems that minimize temperature variations themselves to achieve a high degree of temperature stability and imaging accuracy.

Another liquid supply system which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film Of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

The present invention can be applied to any immersion lithography apparatus, in particular, but not exclusively, those liquid supply systems mentioned above.

In an embodiment, there is provided a lithographic apparatus comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a liquid supply system configured to at least partly fill a space between the projection system and the substrate with a liquid, the liquid supply system comprising a temperature controller configured to adjust the temperature of the substrate, the liquid and at least a part of the projection system towards a substantially common target temperature.

In an embodiment, the temperature controller comprises a liquid flow rate adjustment device configured to adjust a flow rate of the liquid so as to optimize a difference between the substantially common target temperature and the temperatures of the substrate, the liquid and the at least part of the projection system. In an embodiment, the temperature controller comprises a liquid temperature adjustment device configured to adjust the liquid temperature so as to optimize a difference between the substantially common target temperature and the temperatures of the substrate, the liquid and the at least part of the projection system. In an embodiment, the temperature controller comprises a PID controller configured to achieve convergence towards the substantially common target temperature. In an embodiment, the substantially common target temperature is set to a predetermined value.

In an embodiment, there is provide a lithographic apparatus comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a liquid supply system configured to at least partly fill a space between the projection system and the substrate with a liquid; and a projection system compensator configured to adjust an optical property of the projection system in response to a distortion in a pattern exposed on the substrate caused by a difference in temperature of the projection system, the substrate, the liquid, or any combination thereof, from a target temperature.

In an embodiment, the projection system compensator comprises a patterned radiation beam distortion detector arranged to detect distortion of the patterned radiation beam. In an embodiment, the patterned radiation beam distortion detector comprises: an optical detector arranged to detect radiation of the patterned radiation beam reflected from the substrate; and a comparator configured to compare the detected radiation with a standard pattern in order to detect a distortion of the patterned radiation beam. In an embodiment, the projection system compensator comprises: a temperature sensor arranged to measure the temperature of at least a part of the projection system, the substrate, the liquid, or any combination thereof; and a storage device capable of storing a table of calibration data, the calibration data representing adjustments to be applied to an optical property of the projection system in response to a measurement of the temperature sensor. In an embodiment, the projection system compensator comprises a PID controller configured to achieve convergence of the distortion to within a limit.

In an embodiment, there is provided a device manufacturing method comprising: projecting, using a projection system of a lithographic apparatus, a patterned beam of radiation through a liquid onto a target portion of a substrate; and adjusting the temperature of the substrate, the liquid and at least a part of the projection system towards a substantially common target temperature.

In an embodiment, adjusting the temperature comprises adjusting a flow rate of the liquid so as to optimize a difference between the substantially common target temperature and the temperatures of the substrate, the liquid and the at least part of the projection system. In an embodiment, adjusting the temperature comprises adjusting the liquid temperature so as to optimize a difference between the substantially common target temperature and the temperatures of the substrate, the liquid and the at least part of the projection system. In an embodiment, adjusting the temperature is performed using a PID controller to achieve convergence towards the substantially common target temperature. In an embodiment, the substantially common target temperature is set to a predetermined value.

In an embodiment, there is provided a device manufacturing method comprising: projecting, using a projection system of a lithographic apparatus, a patterned beam of radiation through a liquid onto a target portion of a substrate; and adjusting an optical property of the projection system in response to a distortion in a pattern exposed on the substrate caused by a difference in temperature of the projection system, the substrate, the liquid, or any combination thereof, from a target temperature.

In an embodiment, the method comprises detecting distortion of the patterned radiation beam. In an embodiment, detecting distortion of the patterned radiation beam comprises detecting radiation of the patterned radiation beam reflected from the substrate and comparing the detected radiation with a standard pattern in order to detect a distortion of the patterned radiation beam. In an embodiment, the method comprises measuring the temperature of at least a part of the projection system, the substrate, the liquid, or any combination thereof and wherein adjusting an optical property comprises determining the adjustment to be applied to an optical property of projection system from a table of calibration data using the measurement from the temperature sensor. In an embodiment, adjusting an optical property is performed using a PID controller to achieve convergence of the distortion to within a limit.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising:
   at least partly filling a space between (i) a projection system of a lithographic apparatus and (ii) a movable table, with a liquid, the filling comprising directing a flow of the liquid into the space or onto a localized area of an object;
   projecting a radiation beam through the liquid onto a radiation-sensitive target portion of a substrate;
   measuring temperature information of the liquid-exposed substrate or of the movable table, using a temperature sensor; and
   adjusting, based on the temperature information or a parameter derived from the temperature information, an optical property of the projection system using an adjustable element arranged in the projection system.

2. The method of claim 1, wherein the adjusting comprises achieving convergence of the temperature information or the parameter derived from the temperature information toward respectively a target temperature or target parameter value, to within a limit.

3. The method of claim 1, wherein the temperature information comprises temperatures at a plurality of locations in or on the substrate, or in or on the movable table.

4. The method of claim 1, wherein the adjusting comprises causing introduction of an optical distortion in the projection system via the adjustable element to adjust the optical property.

5. The method of claim 1, wherein the adjusting comprises adjusting the optical property of the projection system in response to a distortion in a pattern generated on the substrate caused by a difference in temperature of an optical element of the projection system, of the substrate, of the liquid, or of a combination selected therefrom, from a respective target temperature.

6. The method of claim 1, further comprising changing the temperature of the liquid based on the temperature information.

7. The method of claim 1, wherein the adjusting comprises processing calibration data, the calibration data representing adjustments to be applied to the optical property of the projection system in response to the temperature information.

8. A device manufacturing method comprising:
at least partly filling a space between (i) a projection system of a lithographic apparatus and (ii) a movable table, with a liquid, the liquid confined in a localized area of the movable table;
projecting a radiation beam through the liquid onto a radiation-sensitive target portion of a substrate;
obtaining temperature information using a temperature sensor system provided with the movable table, the temperature sensor system configured to obtain the temperature information at a plurality of locations; and
adjusting, based on the temperature information at the plurality of locations or a parameter derived from the temperature information at the plurality of locations, an optical property of the beam of radiation.

9. The method of claim 8, wherein the obtaining comprises using a thermometer of the temperature sensor system to obtain temperature information, wherein the thermometer is located at a position below where the substrate is located.

10. The method of claim 8, wherein the projection system further comprises an adjustable element and wherein the adjusting comprises controlling the optical property using the adjustable element.

11. The method of claim 8, wherein the adjusting comprises changing the temperature or a flow rate of the liquid based on the temperature information.

12. The method of claim 8, wherein the filling comprises using an inlet, located below a bottom surface of the projection system, to direct a flow of the liquid to the localized area and further comprising confining the liquid to the localized area using a structure, the structure comprising an outlet configured to confine and remove liquid from the space.

13. The method of claim 8, wherein the filling comprises providing a laminar flow of the liquid into a path of the radiation beam through the space.

14. A device manufacturing method comprising:
at least partly filling a space between (i) a projection system of a lithographic apparatus and (ii) a substrate, with a liquid;
projecting a radiation beam through the liquid onto a radiation-sensitive target portion of the substrate;
determining temperature information, or a parameter derived from the temperature information, for the liquid or a component in the lithographic apparatus that is arranged to come in contact with the liquid; and
adjusting, based on the temperature information or the parameter derived from the temperature information, a movable object in a path of the radiation beam.

15. The method of claim 14, wherein the projection system further comprises an adjustable element as the movable object and wherein the adjusting comprises controlling the adjustable optical element to change an imaging property of the radiation beam.

16. The method of claim 14, wherein the determining comprises sensing a temperature at a plurality of locations of the liquid or the component, to determine the temperature information or the parameter derived from the temperature information.

17. The method of claim 14, wherein the determining comprises using a thermometer located at a position below the substrate.

18. The method of claim 14, wherein the adjusting comprises changing the temperature or a flow rate of the liquid based on the temperature information.

19. The method of claim 14, wherein the filling comprises using an inlet, located below a bottom surface of the projection system, to direct a flow of the liquid to a localized area of the substrate and further comprising confining the liquid to the localized area using a structure, the structure comprising an outlet configured to confine and remove liquid from the space.

20. The method of claim 14, wherein the component is the substrate, a movable table, an optical element of the projection system nearest the substrate, or any combination selected therefrom.

* * * * *